(12) United States Patent
Bosnyak et al.

(10) Patent No.: US 6,515,501 B2
(45) Date of Patent: Feb. 4, 2003

(54) SIGNAL BUFFERS FOR PRINTED CIRCUIT BOARDS

(75) Inventors: Robert J. Bosnyak, San Jose, CA (US); Jose M. Cruz-Albrecht, Palo Alto, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 09/873,093

(22) Filed: Jun. 1, 2001

(65) Prior Publication Data

US 2002/0180517 A1 Dec. 5, 2002

(51) Int. Cl.$^7$ .................. H03K 19/003; H03K 17/16
(52) U.S. Cl. ................. 326/30; 326/26; 326/27; 326/83; 326/86
(58) Field of Search ............... 326/26, 27, 30, 326/83, 86; 327/564

(56) References Cited

U.S. PATENT DOCUMENTS

| | | | |
|---|---|---|---|
| 3,832,575 A | | 8/1974 | Dasgupta et al. |
| 5,512,853 A | | 4/1996 | Ueno et al. |
| 5,751,161 A | * | 5/1998 | Wei et al. .................. 326/30 |
| 6,066,973 A | * | 5/2000 | Sekino et al. .............. 326/30 |
| 6,072,334 A | * | 6/2000 | Chang ....................... 326/63 |
| 6,128,685 A | * | 10/2000 | Cronin ...................... 326/30 |
| 6,288,564 B1 | * | 9/2001 | Hedberg ..................... 326/21 |
| 6,292,407 B1 | * | 9/2001 | Porter et al. ............... 326/30 |
| 6,304,098 B1 | * | 10/2001 | Drost et al. ................. 326/26 |
| 6,323,674 B1 | * | 11/2001 | Shrivastava et al. ......... 326/30 |

FOREIGN PATENT DOCUMENTS

EP     0 533 549 A1    3/1993

* cited by examiner

Primary Examiner—Michael G. Lee
Assistant Examiner—Steven S. Paik
(74) Attorney, Agent, or Firm—Zagorin, O'Brien & Graham, LLP

(57) ABSTRACT

An improved signal buffer configuration has been developed for transmitting communication signals across line traces between ICs on a printed circuit board, printed wiring board, multi-chip module, integrated circuit carrier or package, or other interconnect substrate. For example, in some realizations, multiple ICs having mismatched input and output impedances are mounted on an printed circuit board and communicate with each other via line traces. A signal buffer IC is placed in-line with the connecting line trace. The buffer is sized to fit within the pitch spacing of the line trace and contains an input impedance control circuit and an output impedance control circuit. These impedance control circuits are adapted to receive a control signal to set the input and output impedances of the buffer to correspond to the impedances of the connecting line traces. In this manner, the impedances between the ICs connected by this line trace are effectively matched and transmission line errors between them are reduced.

40 Claims, 13 Drawing Sheets

| A B C | Z |
|-------|---|
| 0 0 0 | $Z^1 + Z^2 + Z^3$ |
| 0 0 1 | $Z^1 + Z^2$ |
| 0 1 0 | $Z^1 + Z^3$ |
| 0 1 1 | $Z^1$ |
| 1 0 0 | $Z^2 + Z^3$ |
| 1 0 1 | $Z^2$ |
| 1 1 0 | $Z^3$ |
| 1 1 1 | 0 |

SIGNAL BUFFERS FOR PRINTED CIRCUIT BOARDS

BACKGROUND OF THE INVENTION

1. Field of the Invention

The present invention relates to signal transmission systems, and more particularly to techniques for transmitting signals between integrated circuit (IC) devices on printed circuit boards.

2. Description of the Related Art

Packaged integrated circuits (ICs) are commonly interconnected on printed circuit board (PC boards) by layers of conductors (commonly referred to as line traces). Modem PC boards have as many as 20–24 layers of line traces with pitch spacings as small as 4 MILs. As technology progresses, the signal transfer rate between ICs over these line traces increases as does the length and density of the line traces.

When the impedances between two ICs are mismatched, communication signal integrity between the ICs is degraded by effects such as reflections (e.g., transmission line effect) and dispersion (e.g., skin effect, dielectric losses, and trace resistances). These effects are accentuated with increased signal frequencies and the advancing lengths and densities of line traces found in today's PC board designs. Many of the ICs utilized in these designs are "off the shelf" devices in which their input and output impedance characteristics are not well controlled. A solution to better match the impedance between ICs is to place appropriate components, such as resistors and capacitors, on the line traces connecting the ICs. This addition can help compensate for transmission line effects and reduce voltage reflections. These techniques have drawbacks. Reactive components exhibit impedance change with frequency. Matching networks becomes complex if they are designed to match impedance over a wide spectrum. In addition, these components offer no gain. A resistive termination is preferable, but printed circuit board impedance and IC driving and receiving impedance are subject to manufacturing tolerances. This makes it difficult to establish a nominal value.

A new method of transmitting signals over the traces between ICs on a PC board is needed that enables signals to be transmitted over line traces while encountering limited signal degradating effects such as reflections or dispersions. The present invention addresses these and other problems by providing a method and device for maintaining signal integrity by matching impedances between ICs.

SUMMARY OF THE INVENTION

The present invention provides an improved method of transmitting communication signals across line traces between ICs on a printed circuit board (sometimes more generally referred to as a printed wiring board), multi-chip module, integrated circuit carrier or package, or other interconnect substrate. For purposes of illustration only, and without loss of generality, we use PCB terminology throughout the description. Nonetheless, persons of ordinary skill in the art will appreciate, based on the description herein, variations (including suitable scale variations, connection and attachment technology variations, material selections, etc.) suitable for the interconnect substrate employed by, or in conjunction with, a particular exploitation of the present invention.

In accordance with one aspect of the present invention, multiple ICs having mismatched input and output impedances are mounted on a PC board and communicate with each other across a conductor called a PC line trace. A signal buffer IC is placed in-line with the connecting line trace. The buffer is sized to fit within the pitch spacing of the line trace and contains an input impedance control circuit and an output impedance control circuit. These impedance control circuits are adapted to receive a control signal to set the input and output impedances of the buffer to correspond to the impedances of the connecting line traces. In this manner, the impedances between the ICs connected by this line trace are effectively matched and transmission line errors between them are reduced.

In general, receiving and driving impedances should match the characteristic impedance of the network to which they are connected or connectable. Such matching can be performed by switching on or off transistors of a signal buffer at the receiver and driver to the point where reflections are minimized or reduced to a suitable level. A feedback system is preferred where each line is driven during a calibration phase and the reflection levels are used as an error signal for switching transistors into and out of the receiver and driver until the reflections are minimized. This calibration phase can occur at a very low frequency, thereby minimizing the impact on timing overhead because changes in the physical properties of the system are relatively slow compared to signal speed.

In another embodiment of the present invention, the signal buffer is adapted to interface with multiple line traces and the impedance control circuits are capable of independently matching the corresponding impedances for each line trace.

In another embodiment, the IC package for the signal buffer is designed to be placed on existing line traces. In this embodiment, PC board includes two ICs which are connected by a line trace. The line trace is severed, and a signal buffer IC is placed on the PC board in-line with the severed line trace. The two severed ends of the line trace are then coupled to the signal buffer IC. In this manner, the impedance between the ICs can be matched after the PC board is manufactured.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

These and other features and advantages of the invention will now be described with reference to the drawings summarized above. These drawings and the associated descriptions are provided to illustrate a preferred embodiment of the invention, and not to limit the scope of the invention. Throughout the drawings, reference numbers are re-used to indicate correspondence between referenced elements.

First in brief overview, the present invention involves the use of a signal buffer IC designed to couple line traces between multiple ICs and to match the impedances of the line traces at the couplings. While not limited thereto, the invention may be more easily understood by its use in support of reducing communication signal reflections (e.g., transmission line effects) and dispersion (e.g., skin effect, dielectric losses, and line trace resistance) between ICs on a PC board.

Figure 1:
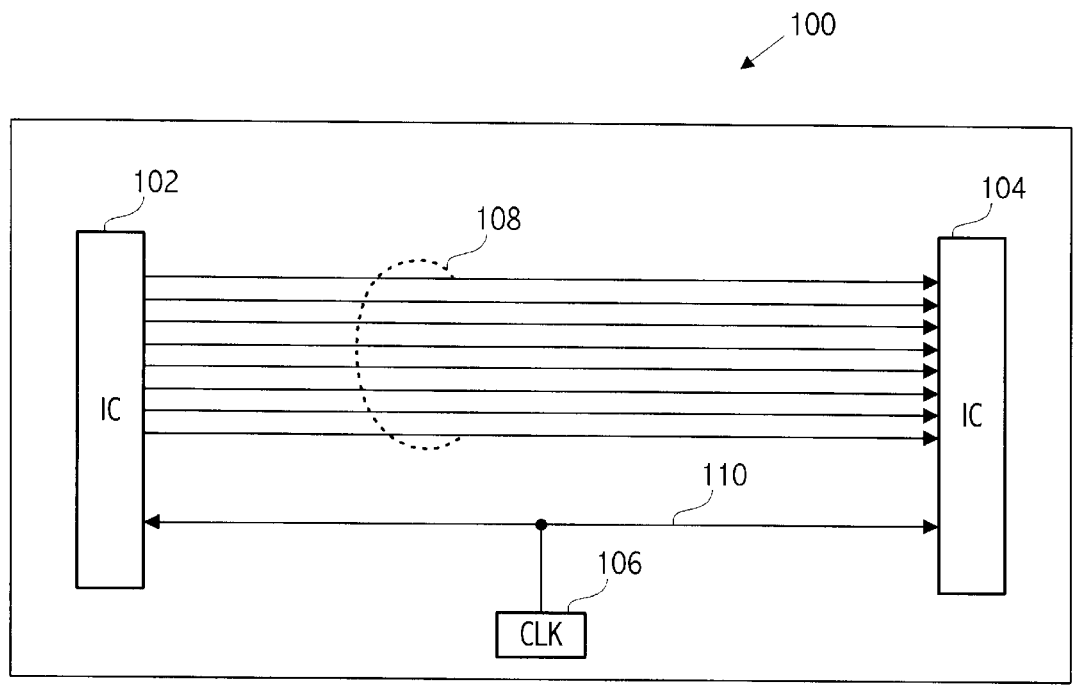
FIG. 1 illustrates an exemplary printed circuit board (PCB) having two generic integrated circuits (ICs) and a clock generator coupled together by line traces.

For example, referring now to FIG. 1, there is depicted a PC board 100 with a first IC 102 coupled transmit data signals to a second IC 104 via line traces 108. Both ICs are also coupled to receive a clock signal transmitted from clock 106 via line trace 110. The ICs depicted could include any of several devices which send or receive data signals such as a microprocessor, memory, transceiver, network switch, controller, etc. In the circuit shown, IC 102, IC 104 and clock 106, each have a different impedance from the other devices. As a result, communication signals transmitted between them are degraded due to transmission line effects and dispersion.

Figure 2:
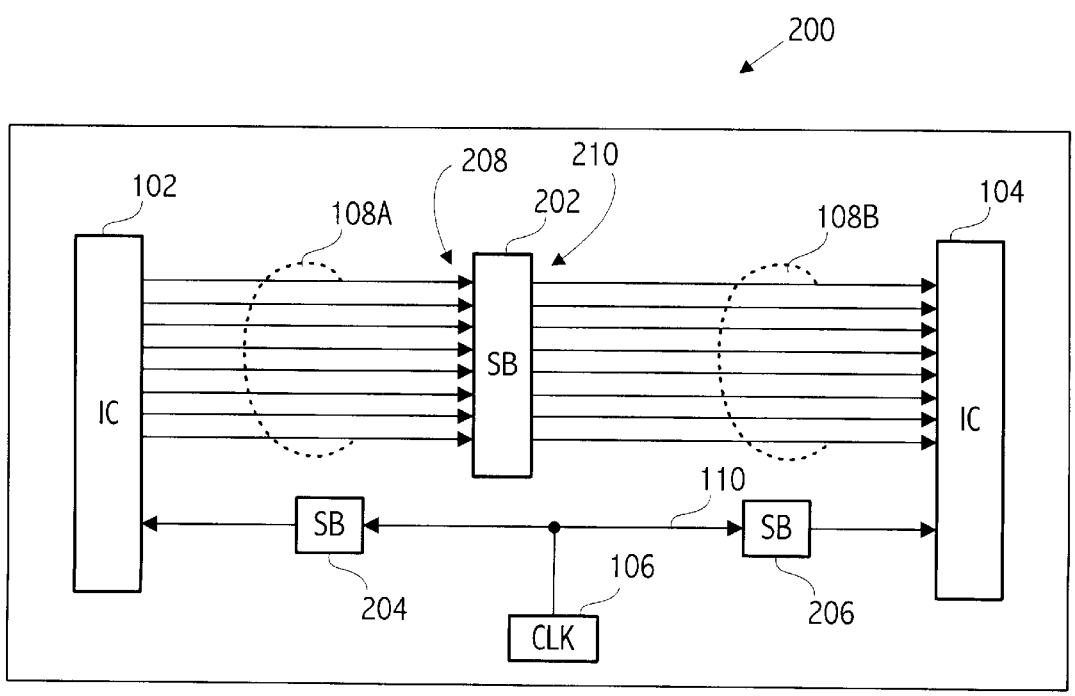
FIG. 2 depicts an exemplary PCB with the addition of three buffers configurations in accordance with respective embodiments of the present invention.

Turning to FIG. 2, there is depicted a PC board 200 including components such as illustrated on PC board 100 with the addition of signal buffer 202, signal buffer 204, and signal buffer 206 in accordance with a realization of the present invention. As illustrated, signal buffer 202 is located in-line with line traces 108 (shown as line traces 108A and 108B) between IC 102 and IC 104. Signal buffer 202 receives data signals transmitted from IC 102 on line traces 108A at signal buffer input 208 and retransmits the data signals on to line traces 108B at the signal buffer output 210. Signal buffer 202 includes an input impedance control circuit and an output impedance control circuit. These circuits are utilized to configure the input and output impedances of the signal buffer to correspond to the impedance as seen from line traces 108A at the signal buffer input 208 and to correspond to the impedance as seen from line traces 108B at the signal buffer output 210. In this manner, the circuits between IC 102 and IC 104 are tuned to reduce degrading effects caused by mismatched impedances. In the example shown, there are eight individual line traces. In other realizations, the number of line traces could be as few as one or as many as needed. As illustrated, line traces connected to the signal buffer input 208 originate from a single IC, and line traces connected to the signal buffer output 210 terminate to a signal IC. However, in other realizations, various line traces could originate from or terminate to other ICs or even to other signal buffers. In such realizations, the input and output impedances of the signal buffer 202 can be independently selected to an appropriate impedance at the various inputs and outputs thereof.

Turning now to the connections among clock 106, IC 102 and IC 104, there is shown signal buffer 204 and signal buffer 206 placed in-line with line trace 110. In this configuration, two signal buffers are utilized to match the two input impedances of IC 102 and IC 104 and the output impedance of clock 106.

The depicted signal buffers 204 and 206 depicted in FIG. 2 are typically configured as single in-line packages and couple between a single input and output line trace. Depending upon the characteristics of the PC line traces, such as density or length, and the signal quality of the clock signal, additional signal buffers may be placed in-line with signal buffers 204 and 206 to maintain the integrity of the clock signal.

Figure 3:
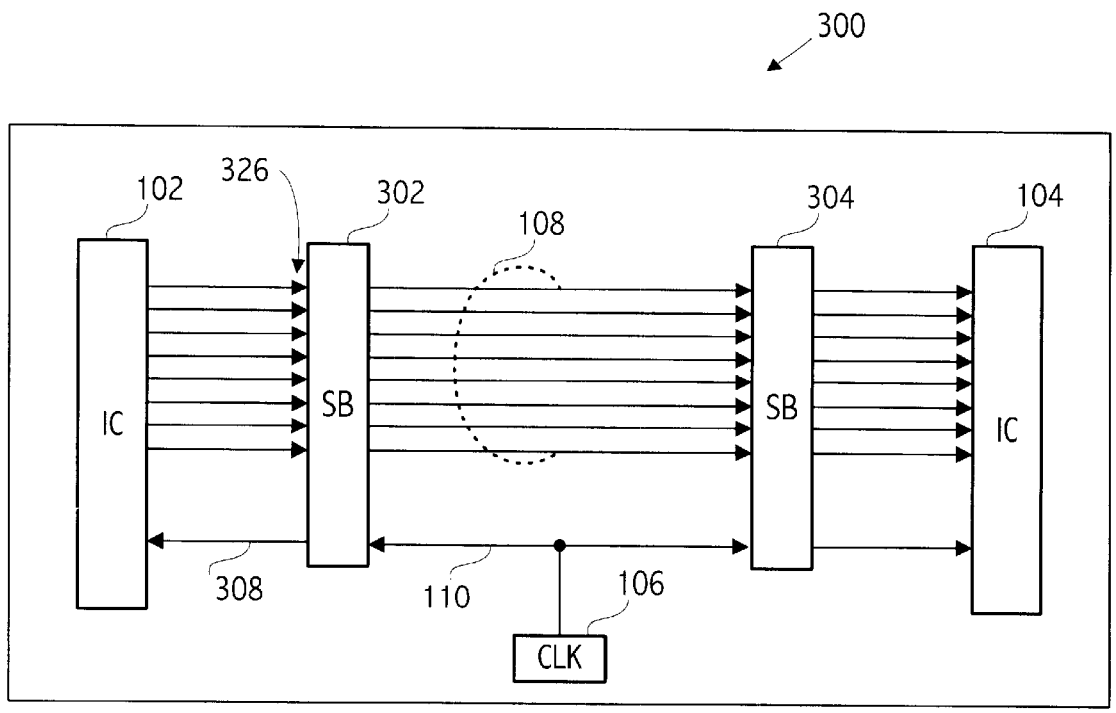
FIG. 3 illustrates an exemplary PCB with the addition of two signal buffers configurations in accordance with an embodiment of the present invention.

In some realizations, signal buffer 204 may be combined with signal buffer 202. For example, FIG. 3 illustrates an alternative realization utilizing two signal buffers 302 and 304 to match impedances between IC 102, IC 104, and clock 106. The signal buffer 302 is depicted as having eight input lines for receiving data signals from IC 102 and one output line 308 for transmitting a clock signal to IC 102. The combination of input and output signal lines can be configured to match the design and layout of the ICs on a PC board. For example, in an additional realization shown in FIG. 4, a PC board 400 comprises a signal buffer 402 having two independently selectable impedance output lines 404 and 406 and one selectable impedance input line 408. In this configuration, the single signal buffer 402 is able to match impedances for all three devices.

Figure 5:
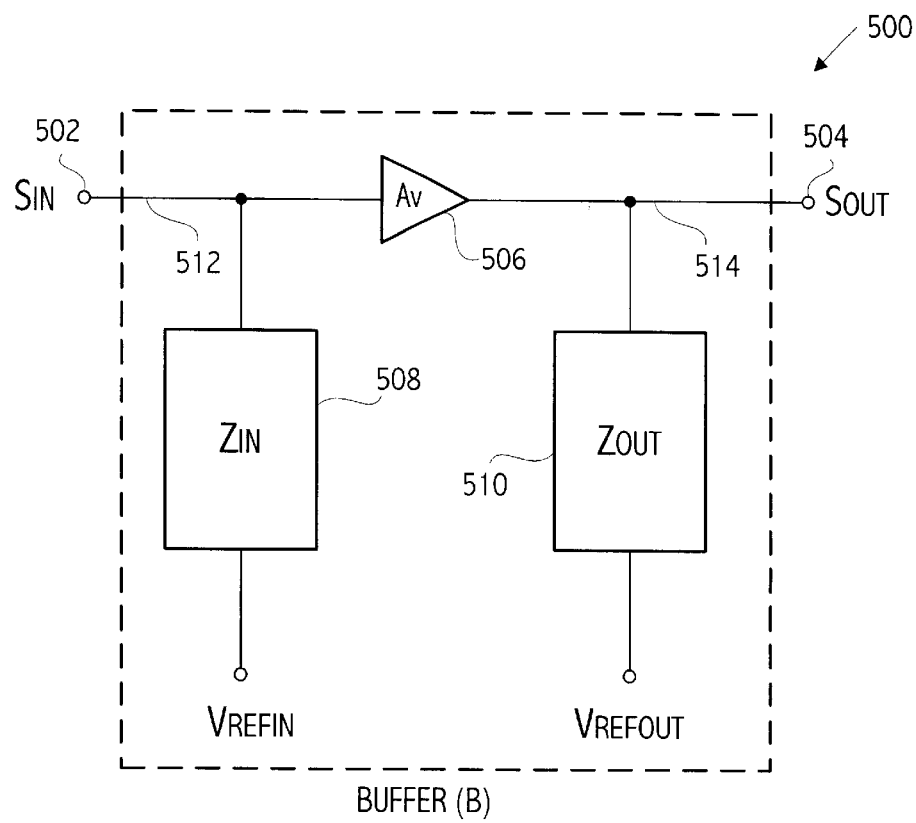
FIG. 5 illustrates a block diagram of a signal buffer IC circuit in accordance with some embodiments of the present invention.

With reference now to FIG. 5, there is depicted an exemplary block diagram of a signal buffer circuit 500 which may be utilized to implement signal buffer 204 in accordance with the present invention. In the present realization, an input signal is transmitted from an input point 502 through a signal gain circuit 506 to an output point 504. The signal gain circuit 506 is well understood in the art and its internal design is not critical to the present invention.

Input impedance control circuit 508 couples the input line 512 to an input reference voltage (VREFIN). The impedance ($Z_{IN}$) of the input impedance control circuit 508 is configured to match the impedance as seen at the input point 502. Output impedance control circuit 510 couples the output line 514 to an output reference voltage (VREFOUT). The impedance ($Z_{OUT}$) of the output impedance control circuit 510 is configured to match the impedance as seen at the output point 504. VREF is selected to optimize performance. A driving IC may have switching levels slightly askew from optimum for a receiving IC. In such case, the VREF helps by offsetting these differences. A variety of suitable logic specifications exist. Selecting VREF at the input centered at the 50% level of the output voltage excursions of the driver tends to minimize the differences in speeds between the transitions from LO to Hi and Hi to LO. Then, selecting VREF out at the center or trigger threshold of the receiver minimizes the difference in response at the receiver.

Figure 6:
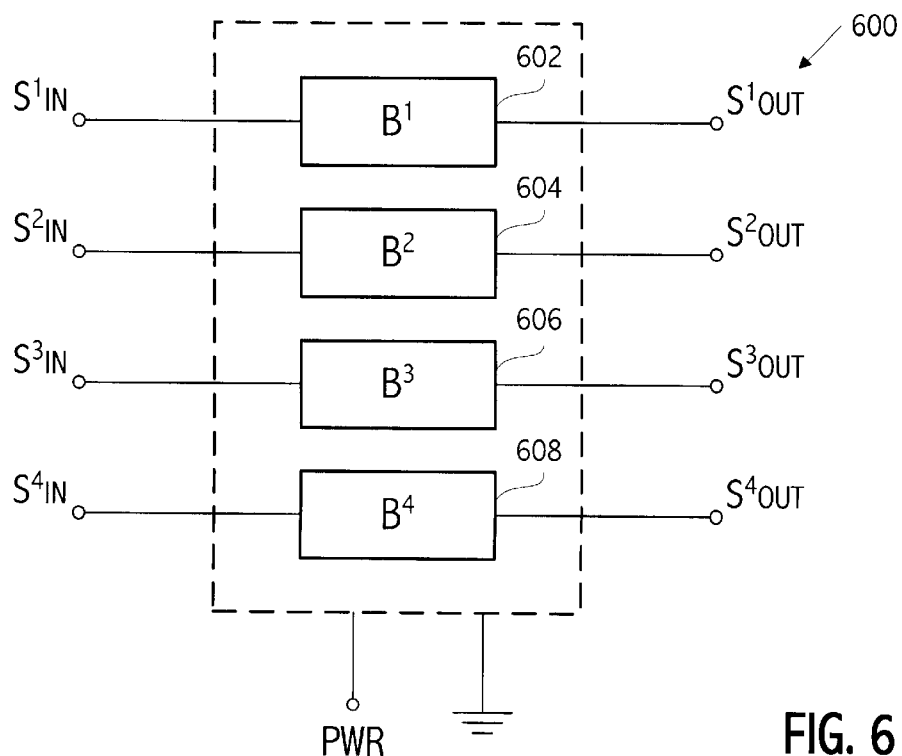
FIG. 6 depicts a block diagram of an IC circuit having four buffer circuits in accordance with some embodiments of the present invention.
Figure 7:
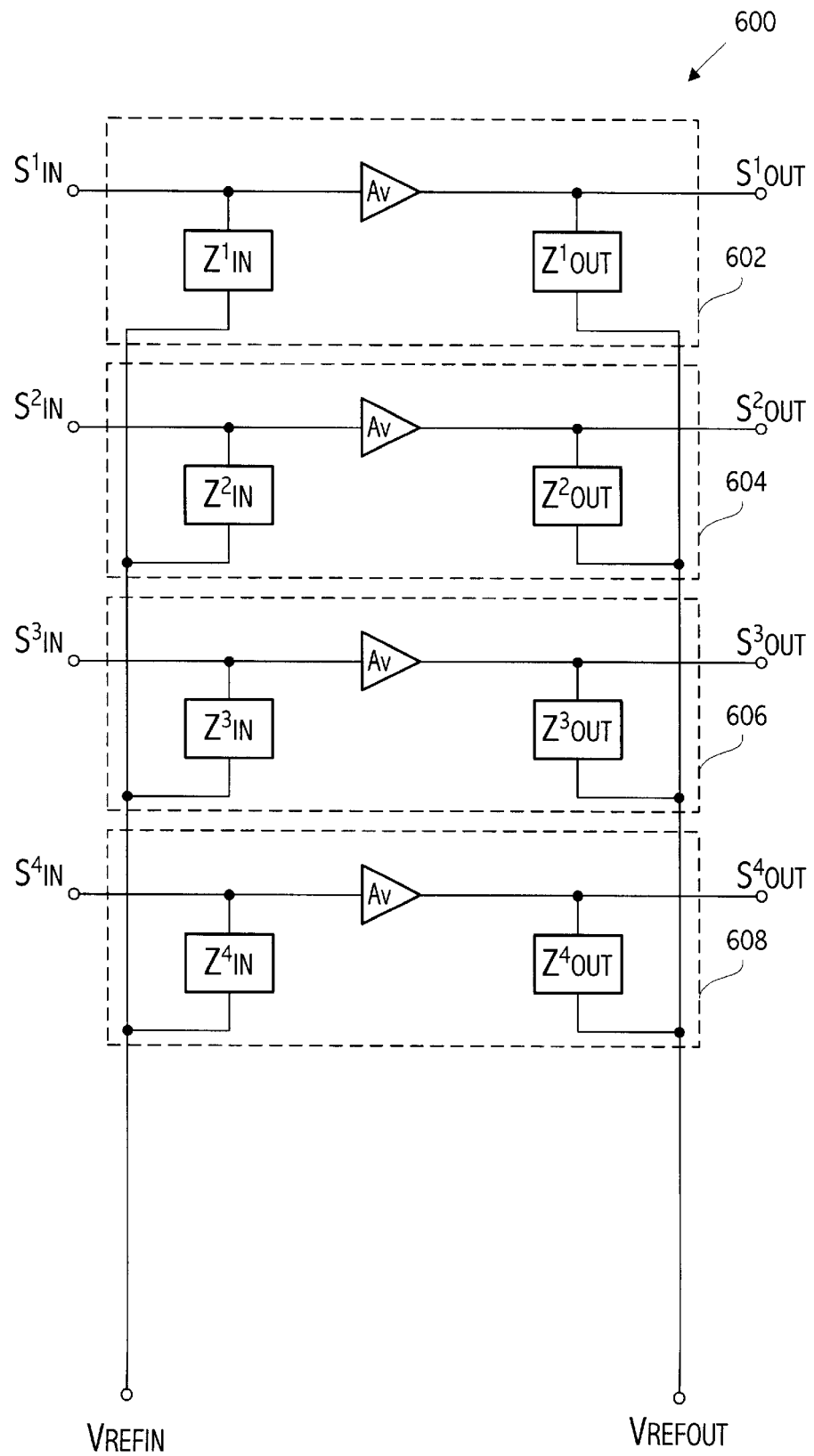
FIG. 7 illustrates a block diagram of the buffer circuits such as shown in FIG. 6.

Looking now at FIG. 6, there is depicted an exemplary block diagram for a signal buffer IC 600 having four input signal lines and four corresponding output signal lines. Signal buffers 602, 604, 606, and 608 each embody a buffer circuit as described in reference to FIG. 5. FIG. 7 depicts a lower level block diagram of signal buffer IC 600. In this illustration, all signal buffers share a common input reference voltage (VREFIN) and a common output reference voltage (VREFOUT). However, in other realizations, separate reference voltages are utilized for different buffer circuits.

Figures 8A, 8B:
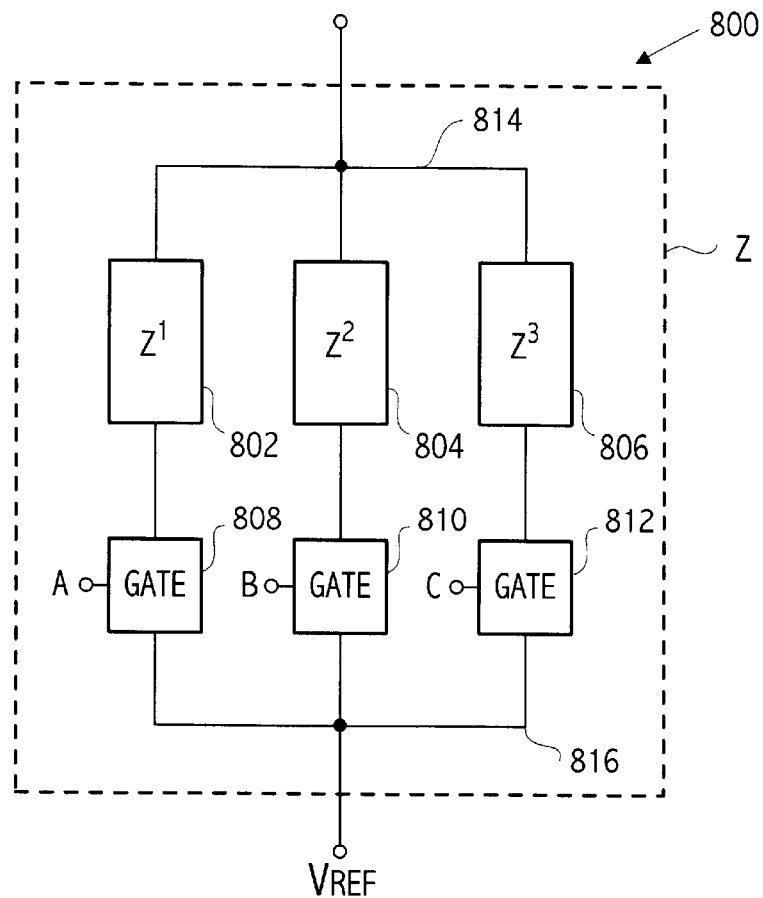
FIG. 8A depicts a block diagram of an exemplary impedance control circuit in accordance with some embodiments of the present invention.
FIG. 8B illustrates corresponding impedance combinations.

Turning now to FIG. 8A, there is shown an impedance control circuit 800 which may be utilized in a realization to configure either the input or output impedance for a buffer circuit in accordance with the present invention. As illustrated, impedance circuits 802, 804, and 806 are each selectively enabled by the respective gates 808, 810, and 812. When enabled, a gate will complete a circuit between the signal line 814 and the voltage reference line 816. In the exemplary circuit shown, the three impedance circuits are coupled in parallel and can yield 8 different impedance combinations between lines 814 and 816 by selectively enabling gates 808, 810, and 812.

Figures 9A, 9B:
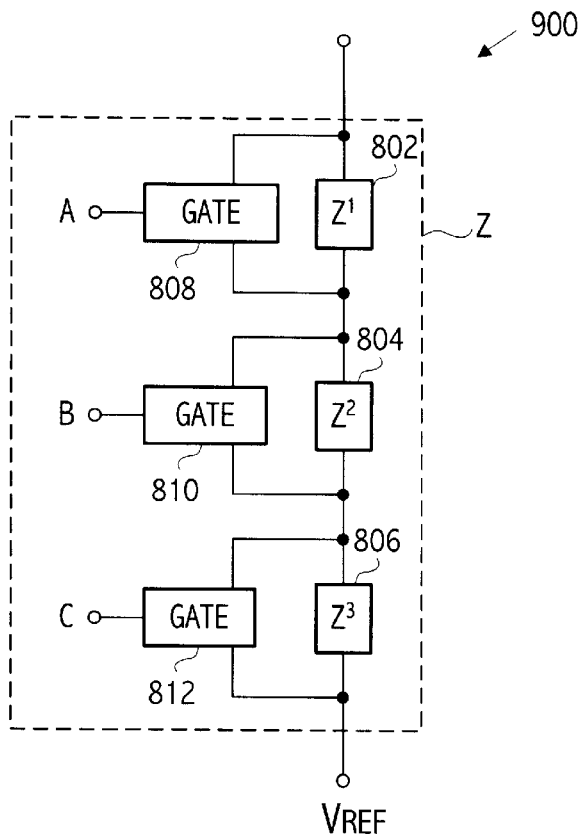
FIG. 9A depicts a block diagram of an exemplary impedance control circuit in accordance with some embodiments of the present invention.
FIG. 9B illustrates corresponding impedance combinations.

The eight (8) possible impedance combinations for this configuration are illustrated in FIG. 8B. While three gates are shown controlling three impedance circuits, it will be clear to those skilled in the art larger or smaller numbers may be employed. Furthermore, alternative circuit configurations are possible. For example, FIG. 9A, depicts a series circuit configuration with impedance circuits 802, 804, and 806 and shunt gates 808, 810, and 812, which may be selectively enabled to achieve a desired impedance. The resulting impedances for this circuit are depicted in FIG. 9B. Although parallel and series configurations have been illustrated, those skilled in the art will recognize a wide variety of suitable variations that nonetheless provide configurable impedance.

Figure 10:
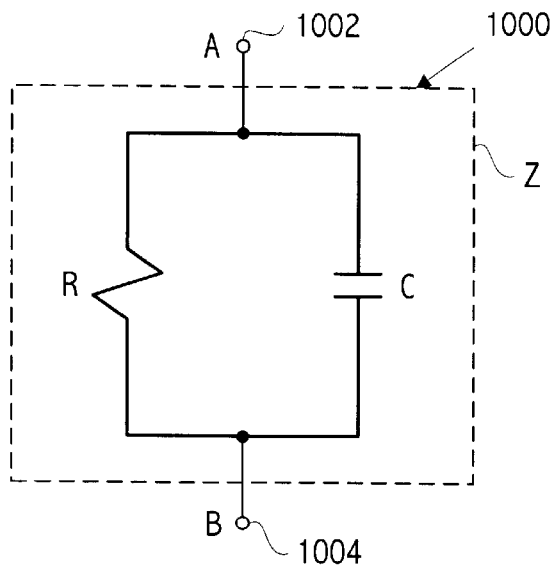
FIG. 10 illustrates a simple RC impedance circuit that may be utilized in accordance with some embodiments of the present invention.

Impedance circuits, such as 802, 804, or 806, may be implemented using any of a variety of circuit techniques, simple or complex, that yield alone or in combination with other impedance circuits, an overall impedance that corresponds to the impedance seen at the corresponding input or output point of the signal buffer. An example of a basic circuit configured to produce a complex impedance is illustrated in FIG. 10. This circuit includes a resistor in parallel with a capacitor and produces a complex impedance between node A 1002 and node B 1004. Other components such as an inductor could also be utilized to configure desired impedances.

Figure 11:
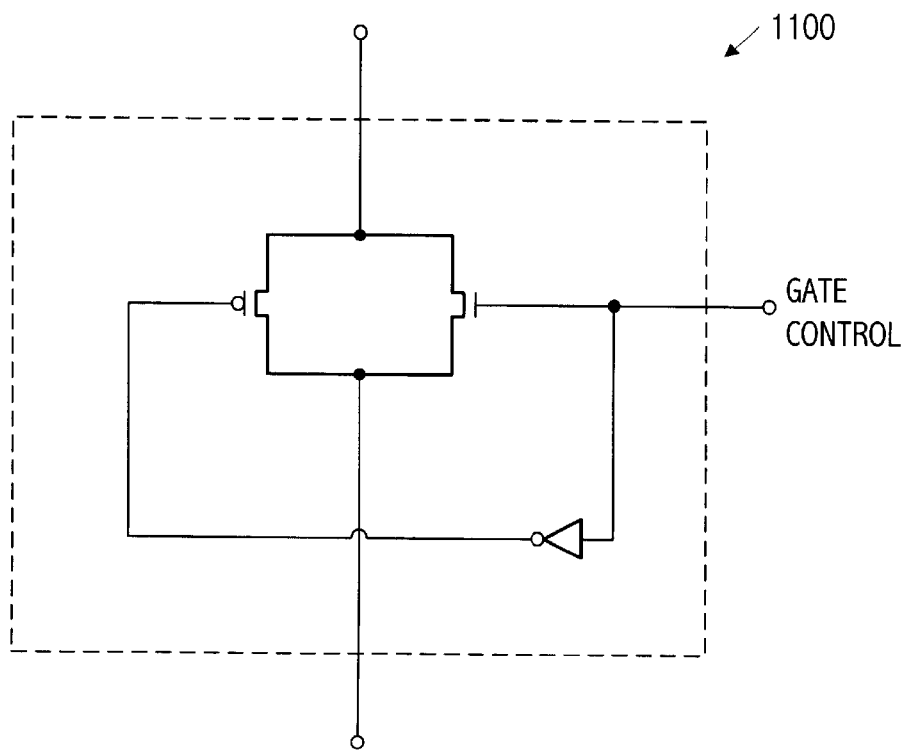
FIG. 11 depicts a circuit diagram of a typical CMOS gate that is utilized in some implementations of the impedance control circuits illustrated in FIGS. 8A and 9A.

Referring now to FIG. 11, there is depicted an exemplary CMOS control gate 1100 which could be utilized in the present invention for gates 808, 810 and 812 to control the selection of individual impedance circuits. This circuit and other gate circuits are well known and understood by those skilled in the art. It is appreciated that other gates, fuseable links and programmable circuits could be utilized to configure the selection of various impedance circuits to produce a desired impedance.

Figure 12:
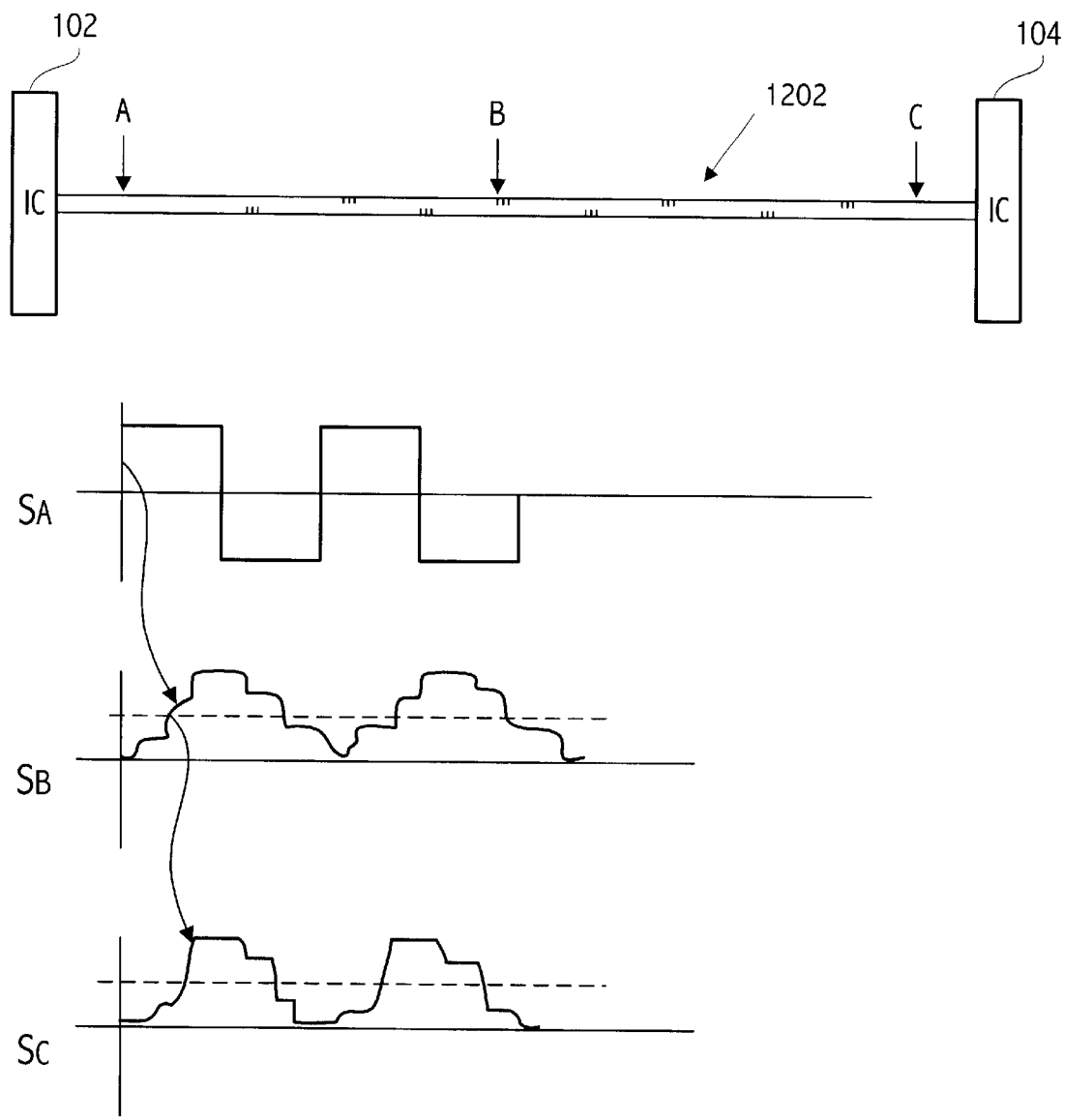
FIGS. 12 and 13 illustrate typical losses of signal integrity, associated with the prior art, as a signal is transmitted from one IC to another.

Moving now to FIG. 12, there is depicted IC 102 coupled to IC 104 via line trace 1202. In this illustration, IC 102 transmits a data signal (S) over line trace 1202 to IC 104. Along line trace 1202, there are three location points A, B, and C. $S_A$, $S_B$, and $S_C$ and their corresponding graphs refer to and describe the data signal S as it passes the three corresponding location points. As can be seen from the graphs, the integrity of data signal S is degraded as it passes location points B and C. As shown, communications between IC 102 and IC 104 are compromised.

FIG. 12 shows a simple hook up between two ICs. Typically, the output of IC 102 would have a resistance of about 10 to 20 ohms. Package adds complex impedance, but they can be ignored for didactic clarity. Typical trace impedance is 50 to 75 ohms and defined as Z0. IC 104 usually has the characteristics of an open circuit. Once a wave is started, energy is reflected by discontinuities along the trace. After several cycles, multiple reflections are transitioning in both directions. The energy is dissipated by the driving resistance. The hypothetical waveforms illustrate one possibility of distortion caused by the superposition of the waves. Actual waveforms are a strong function of impedance and electrical length.

Figure 13:
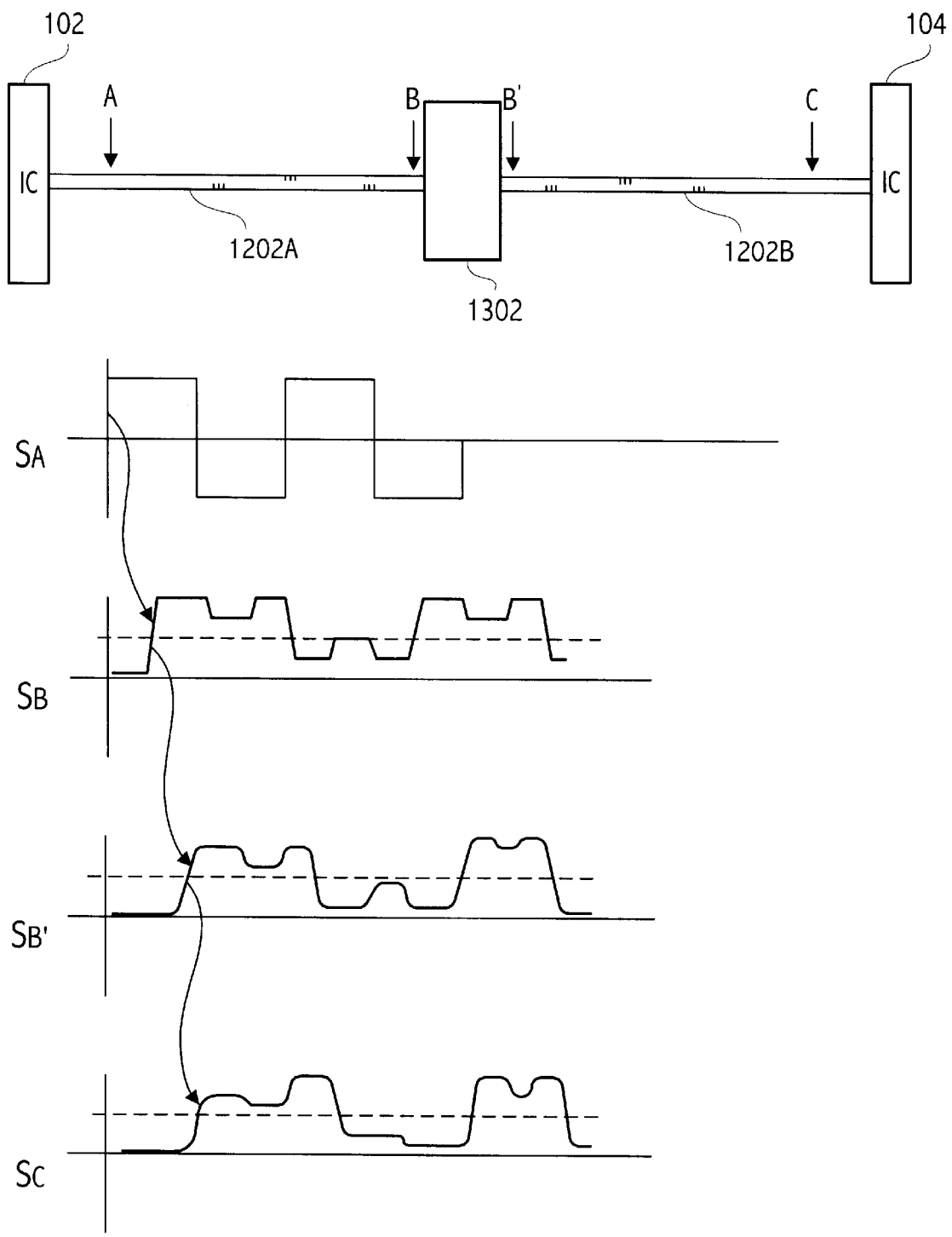

Referring now to FIG. 13, there is depicted the circuit introduced in FIG. 12 with the addition of a typical signal buffer in accordance with the prior art. In this circuit, a standard buffer 1302 is placed in line with the line trace 1202 at location point B. Location point B indicates the input point to signal buffer 1302 and location B' indicates its output point. The input and output impedance of the signal buffer 1302 are not well controlled and do not match either IC 102 or IC 104. In this illustration, IC 102 transmits a data signal (S) over line trace 1202A to signal buffer 1302, and signal buffer transmits the signal over line trace 1202B to IC 104. There are 4 location points identified as A, B, B', and C. $S_A$, $S_B$, $S_{B'}$, and $S_C$ and their corresponding graphs refer to and describe the data signal S as it passes the 4 corresponding location points. As can be seen from the graphs, the integrity of data signal S is degraded as it passes location points B, B', and C. As shown, degradation of data signal S continues to be present with this configuration.

FIG. 13 illustrates a similar scenario, but serialized with two sets of IC interfaces. Some recovery occurs between B and B' because signal buffer 1302 will reconstitute the waveform but may add more distortion in timing. As before, a hypothetical waveform is presented and actual waveforms are a strong function of impedance and electrical length. Note that, in general, the nature of the waveform is unpredictable without prior knowledge of the impedance and driving/receiving characterization. Finally, waveforms obtained using techniques of the present invention will tend to approximate a square wave once calibration has taken place. Nonetheless, some intrinsic delay occurs because of the speed of the waves and buffer delays.

Figure 14:
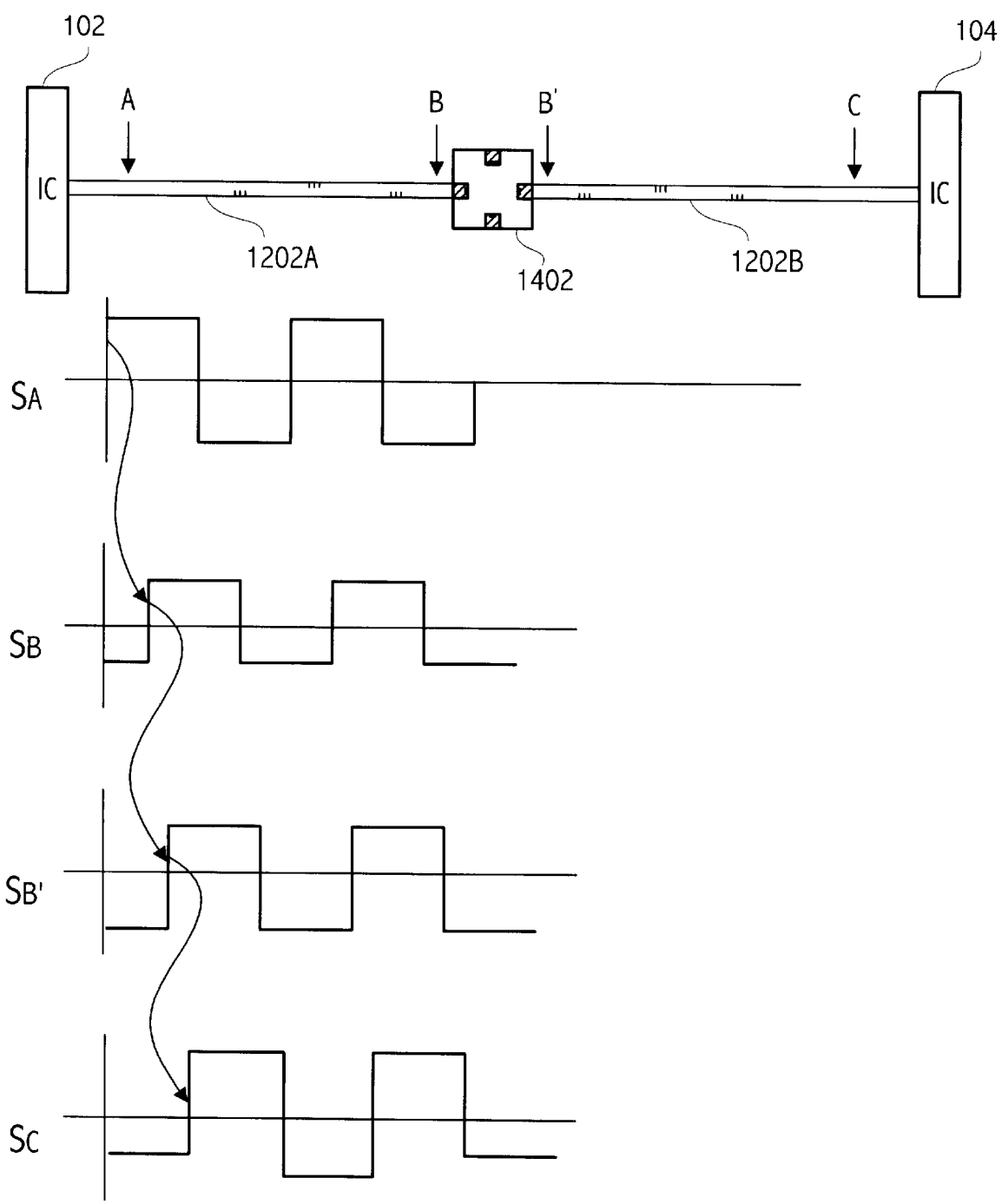
FIG. 14 depicts improved signal integrity, associated with the present invention, as a signal is transmitted from one IC to another.

Now turning to FIG. 14, there is depicted a circuit configuration in accordance with the present invention wherein IC 102 transmits data signal S through signal buffer 1402 to IC 104. In this illustration, the impedance between IC 102 and the input side of signal buffer 1402 is matched and the impedance between IC 104 and the output side of signal buffer 1402 is matched. The graphs of data signal (S) as it passes through location points A, B, B', and C are illustrated as $S_A$, $S_B$, $S_{B'}$, and $S_C$ and demonstrate the ac invention. Ideally, the data signal S is a replica of the input waveform delayed by buffer and wire length.

Package Configuration

As described above, our signal buffer design provides a controllable interface between impedance domains. In this way, implementations of the signal buffer facilitate impedance matching in or to transmission lines having electrical characteristics not ordinarily or precisely known in advance, or for which electrical characteristics are susceptible to change or definition post manufacture. On a long transmission line, the buffer can act to reconstitute a signal. In addition, the buffer can be employed to receive a compromised or slow-edge rate signal and send it out as a strong fast-edge rate signal. Such behavior helps to compensate for the 'smearing' of edge rates.

In general, both input and output impedance may be controlled using any of a variety of controllable impedance structures such as described above. Typically, desired impedance characteristics are selected for a particular application. For example, it may be desirable to introduce a signal buffer into to a strip line or other transmission line structure of a printed circuit board (PCB). In such case, the signal buffer described above is programmed to achieve the desired impedance characteristics.

Introduction of the signal buffer is by any suitable manufacturing method. For example, some PCB configurations may provide connection points corresponding to a particular signal buffer package design. On the other hand, for some applications, an existing PCB trace may be laser severed to allow introduction of a packaged signal buffer. Preferably, low impedance electrical connections between the signal buffer and the PCB are provided using solder bump or other suitable connection technology. In general, both signal traces and power supply voltages are connected to the signal buffer using solder bump technology, although in some configurations, one or the other may be connected using another technology such as wire bonds.

In general, control of the underlying programmable impedance circuitry may be achieved using a variety of methods. External control lines may be provided. In some configurations, programming may be performed as a manufacturing step. Field programmable signal buffer parts may be laser trimmed or programmed with any suitable fuse or anti-fuse technology. Parts so programmed may be inventoried in various impedance configurations or programmed as needed in manufacturing or assembly operations. Alternatively, some configurations of the signal buffer part may receive their programming via power supply connections or, alternatively, via signal trace connections. For example, some parts may be configured to recognize a coded startup signal or bit pattern embedded in a data stream as a signal to program or calibrate impedance circuits.

Whatever the programming configuration, signal buffer packaging is designed to conform to the electrical trace geometries into which it is introduced. Accordingly, package dimensions and connection pitches are closely tied to trace pitch. Several exemplary package configurations are illustrated in FIGS. 15, 16A, 16B, 16C, 17A and 17B.

Figure 15:
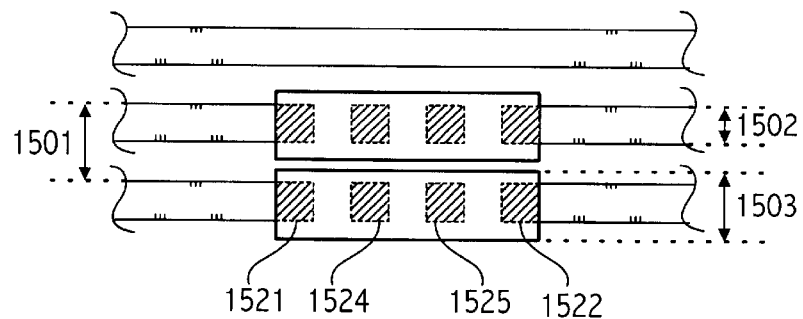
FIG. 15 illustrates a pair of in-line packaged signal buffer ICs laid out on trace pitch in accordance with some embodiments of the present invention.

One exemplary package configuration is illustrated in FIG. 15 and provides signal connections 1521, 1522, as well as power supply voltage connections 1524, 1525 all aligned on trace pitch. Of note, package dimensions are such that signal buffers may be conveniently placed on adjacent traces without mechanical interference. To facilitate such placement, package width 1503 is generally less than or equal to the trace pitch. In a typical configuration, trace pitch 1501 is approximately twice the width 1502 of a typical trace (i.e., trace width and inter-trace spacing are approximately equal); however, more generally, other relations between trace width, inter-trace spacing and trace pitch are possible. For example, in PCB configurations where immunity to crosstalk between traces is important, inter-trace spacing may be wider than, even substantially wider than, trace width. Alternatively, for PCB configurations in which adjacent traces convey a differential signal, it may be desirable for inter-trace spacing to be narrower than trace width. Persons of ordinary skill in the art will appreciate variations suitable for a given implementation. Indeed, some implementations may opportunistically vary inter-trace spacing according to appropriate design considerations. Nonetheless, whatever the particular relation between trace width, inter-trace spacing and trace pitch, a package width less than or equal to the trace pitch allows signal buffers to be conveniently placed on-pitch on adjacent traces.

Figure 16A:
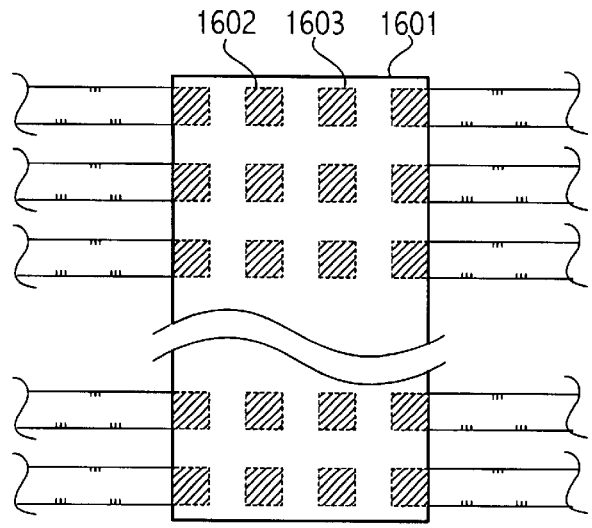
FIGS. 16A, 16B and 16C depict variations on an N-wide packaged signal buffer IC configuration laid out on trace pitch in accordance with some embodiments of the present invention.
Figure 16B:
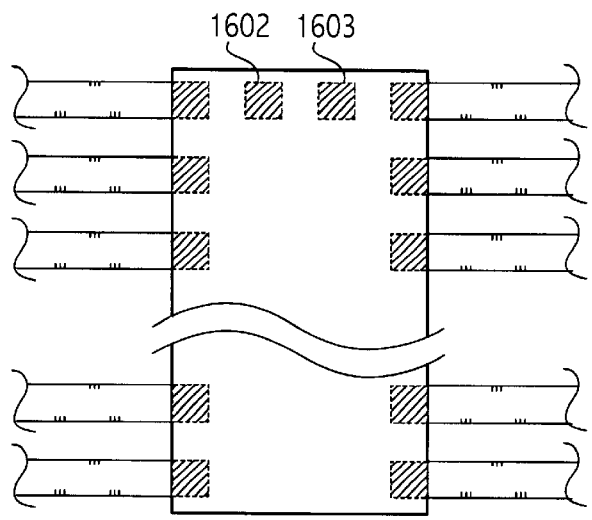
Figure 16C:
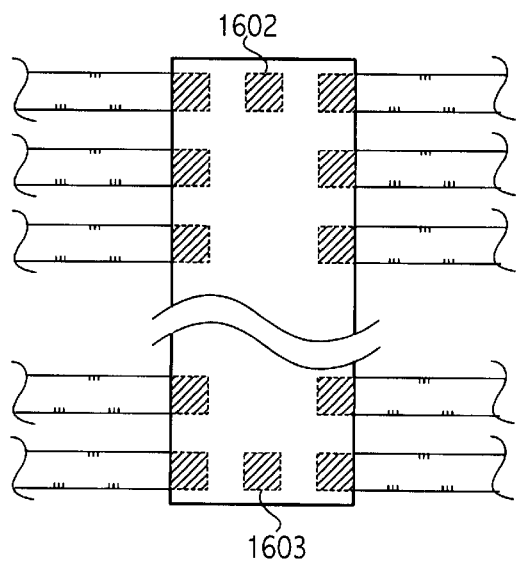

FIGS. 16A, 16B and 16C depict realizations that provide signal buffering for multiple traces within a single package configuration. In some configurations, impedance characteristics for each trace may be individually programmed, while in others impedance programming of some or all trace paths may be ganged or otherwise coordinated. Referring first to FIG. 16A, multiple (typically separate) power supply voltage paths are provided, one per signal buffer. A single package 1601 provides an N-wide array of programmable impedance signal buffer circuits (not shown) such as described above. In general, N may be selected as any convenient number of signal buffers. For example, 2-wide configurations may be desirable for use in connection with adjacent differential signal traces. Alternatively, 8-, 16-, 32-, 64-wide (or larger) configurations may be desirable for use in bus configurations.

FIGS. 16B and 16C depict variations on the theme. In the configuration of FIG. 16B, a single pair of power supply voltage connection points is provided. In general, power supply voltage connection points may be located in any of a variety of locations without limiting placement of an adjacent signal buffer or affecting routing of adjacent traces. Accordingly, placement of power supply voltage connections 1602 and 1603 is merely exemplary. FIG. 16C illustrates still another N-wide configuration.

Figure 17A:
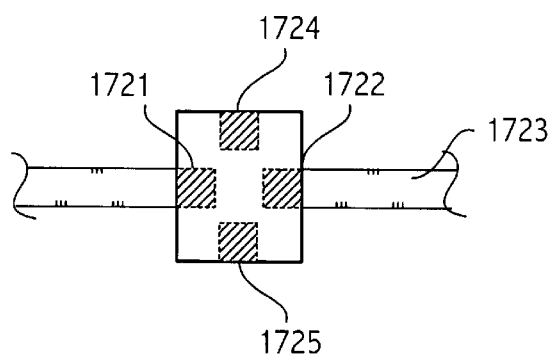
FIGS 17A and 17B illustrate single and N-wide package configurations for a signal buffer in accordance with some embodiments of the present invention.
Figure 17B:
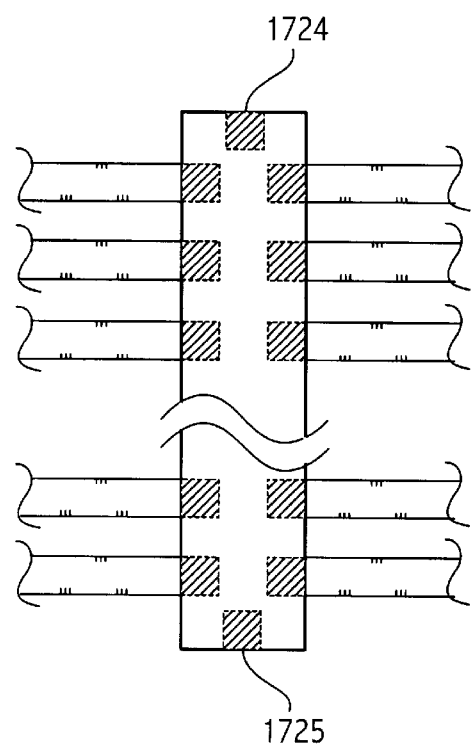

While the preceding package configurations are typically more space efficient, the configuration illustrated in FIG. 17A may be suitable for a variety of isolated single trace applications or in applications where inter-trace spacing a substantially wider than trace width. In the illustrated configuration, a packaged signal buffer includes four connection points, one per edge. Connection points 1721, 1722 allow the signal buffer to be introduced into line trace 1723. Power supply voltages are supplied to programmable impedance circuits (not shown) of the packaged signal buffer via corresponding connection points 1724, 1725. FIG. 17B depicts an exemplary N-wide variation.

To be suitable for surface mount application, dimensions of the various configurations described above are closely related to typical line trace geometries. For example, in some configurations, trace widths and spacings will be on the order of several MILS (5–6 MILS is typical of many implementations, while 3 MILS or less is possible and will become increasingly commonplace in mainstream board designs). Depending on the particular scale employed, a single trace signal buffer configuration may occupy little, if any, more PCB footprint than a surface mounted resistor or capacitor.

Figure 4:
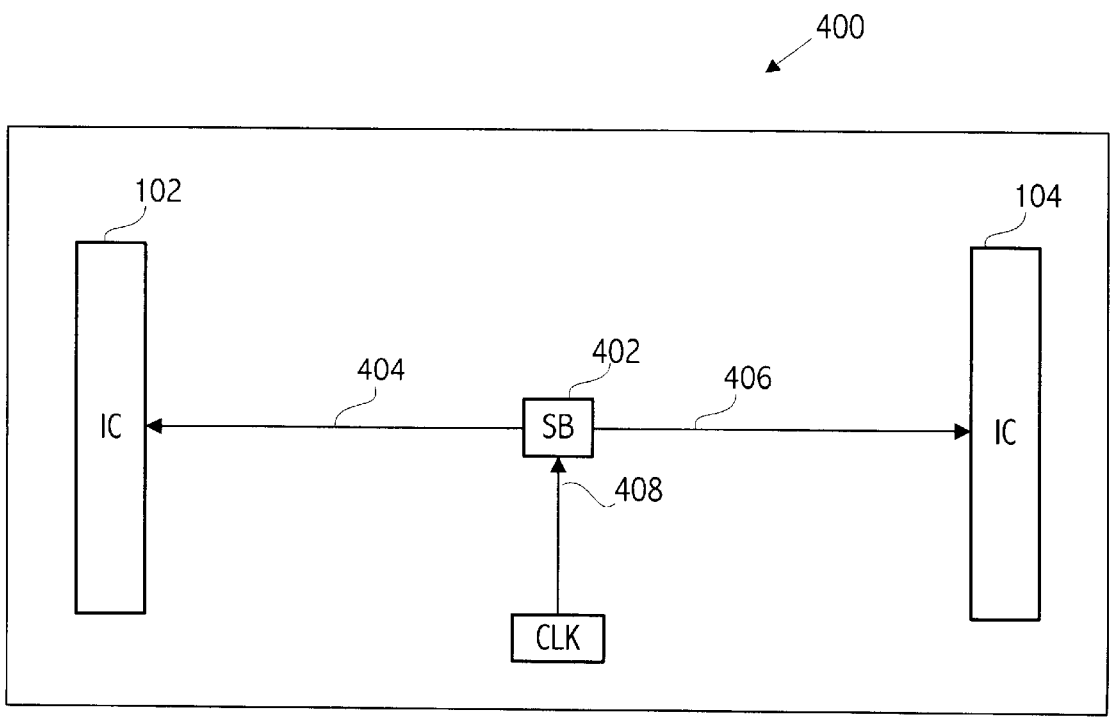
FIG. 4 illustrates an exemplary PCB with two ICs coupled to receive a signal from a clock generator with the support of a signal buffer in accordance with some embodiments of the present invention.
Figure 18A:
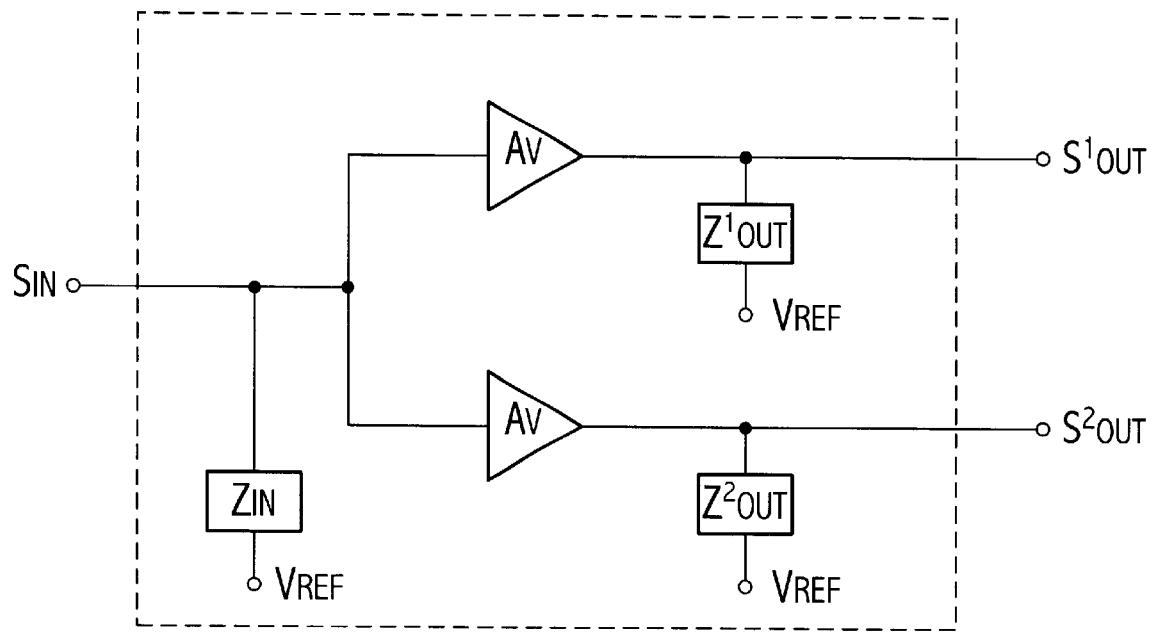
FIG. 18A depicts a block diagram of an alternative signal buffer circuit in accordance with some embodiments of the present invention.
Figure 18B:
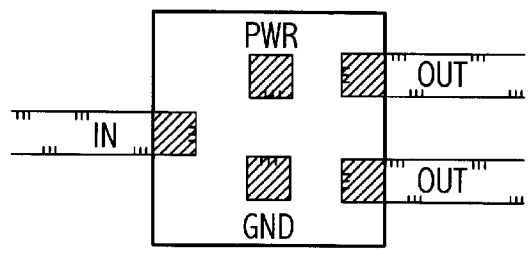
FIG. 18B illustrates an exemplary IC package supporting the circuit of FIG. 18A.

In the previously described packaging layout designs of the signal buffer circuits, there was illustrated one signal buffer output for each signal buffer input. However, those skilled in the art will recognize that the buffer circuit could be configured in accordance with the present invention to support multiple output lines each with its own selectable impedance. For example, FIG. 18A illustrates a simple block diagram which could be utilized to realize the signal buffer 402 as depicted in FIG. 4, and FIG. 18B shows an associated exemplary package design that could be utilized in accordance with this realization. Based on the description herein, persons of ordinary skill in the art will appreciate other variations include configurations with additional fan out, as well as N-wide configurations.

Other Embodiments

It is understood that the present invention can be realized in many forms. The realizations shown herein are intended to illustrate rather than to limit the scope of the invention, it being appreciated that variations may be made without departing from the spirit of the scope of the invention, as those skilled in the art will readily appreciate and understand. Such modifications and variations are considered to be within the preview and scope of the present invention as defined by the appended claims.

What is claimed is:

1. A signal buffer integrated circuit comprising:

plural connection point pairs; and plural programmable impedance circuits coupled between respective of the connection points and powered at least in part via respective couplings to at least one power supply terminal, wherein placement of the connection point pairs is suitable for introduction of the signal buffer integrated circuit into respective wiring traces of an interconnect substrate laid out on a trace pitch thereof.

2. The signal buffer integrated circuit as in claim 1, attached to the interconnect substrate and coupled into the respective wiring traces.

3. The signal buffer integrated circuit as in claim 1, wherein at least one of the programmable impedance circuits comprises an input impedance control circuit, an output impedance control circuit and a signal gain amplifier coupled therebetween.

4. The signal buffer integrated circuit as in claim 1, wherein at least one of the programmable impedance circuits is self-calibrating.

5. The signal buffer integrated circuit as in claim 1, wherein at least one of the programmable impedance circuits is responsive to an externally-supplied programming signal.

6. The signal buffer integrated circuit as in claim 5, wherein the eternally-supplied programming signal is coupled into the signal buffer via one or more of the connection points.

7. The signal buffer integrated circuit as in claim 5, wherein the eternally-supplied programming signal is coupled into the signal buffer via the power supply voltage terminal.

8. The signal buffer integrated circuit as in claim 1, wherein at least one of the programmable impedance circuits is responsive to a state of a field programmable circuit element.

9. The signal buffer integrated circuit as in claim 1, wherein at least one of the programmable impedance circuits further comprises:

separately programmable input and output impedance circuits.

10. The signal buffer integrated circuit as in claim 1, wherein the connection points are couplable into the respective wiring traces of the interconnect substrate using respective solder bumps.

11. The signal buffer integrated circuit as in claim 1, packaged for surface mount onto the interconnect substrate.

12. The signal buffer integrated circuit as in claim 1, wherein the interconnect substrate includes a printed wiring board.

13. The signal buffer integrated circuit as in claim 1, wherein the interconnect substrate includes a multi-chip module.

14. The signal buffer integrated circuit as in claim 1, wherein the interconnect substrate includes an integrated circuit carrier.

15. A packaged signal buffer comprising:

a package suitable for introduction into a wiring trace of an interconnect substrate on a trace pitch thereof, with first and second connection points and at least one power supply voltage terminal defined thereon; and at least one programmable impedance circuit coupled between the first and second connection points and powered at least in part through the at least one power supply voltage terminal.

16. The packaged signal buffer as in claim 15, attached to the interconnect substrate and coupled into a first wiring trace thereof, wherein a substantially identical instance of the packaged signal buffer is also attached to the interconnect substrate and coupled into a second, immediately adjacent wiring trace thereof.

17. The packaged signal buffer as in claim 16, wherein the first and second wiring traces are laterally displaced from each other substantially in accordance with the trace pitch.

18. The packaged signal buffer as in claim 15, further comprising:

additional third and fourth connection points with an additional programmable impedance circuit coupled therebetween, wherein the packaged signal buffer is attached to the interconnect substrate and coupled into respective at least two immediately adjacent wiring traces thereof, the wiring traces laterally displaced from each substantially in accordance with the trace pitch.

19. The packaged signal buffer as in claim 15, wherein the at least one programmable impedance circuit is self-calibrating.

20. The packaged signal buffer as in claim 15,
wherein the at least one programmable impedance circuit is responsive to an externally-supplied programming signal.

21. The packaged signal buffer as in claim 20,
wherein the externally-supplied programming signal is coupled into the packaged signal buffer via either or both of the first and second connection points.

22. The packaged signal buffer as in claim 20,
wherein the externally-supplied programming signal is coupled into the packaged signal buffer via the power supply voltage terminal.

23. The packaged signal buffer as in claim 15,
wherein the at least one programmable impedance circuit is responsive to a state of a field programmable circuit element.

24. The packaged signal buffer as in claim 15, wherein the at least one programmable impedance circuit further comprises:
separately programmable input and output impedance circuits.

25. The packaged signal buffer as in claim 15,
wherein the first and second connection points are couplable into the wiring trace of the interconnect substrate using respective solder bumps.

26. The packaged signal buffer as in claim 15,
attached to the interconnect substrate,
wherein the first and second connection points are coupled into the wiring trace thereof using respective solder bumps.

27. The packaged signal buffer as in claim 15, further comprising:
plural additional pairs of connection points; and
plural additional programmable impedance Circuits disposed between respective of the connection points,
wherein placement of the first, second and additional connection points on the package is suitable for introduction of the package into plural respective wiring traces of the interconnect substrate laid out on a trace pitch thereof.

28. The packaged signal buffer as in claim 15,
wherein the interconnect substrate includes a printed wiring board.

29. The packaged signal buffer as in claim 15,
wherein the interconnect substrate includes a multi-chip module.

30. An apparatus comprising:
an interconnect substrate including plural wiring traces disposed thereon at a trace pitch;
a signal buffer integrated circuit attached to the interconnect substrate, the signal buffer integrated circuit coupled into at least one of the wiring traces via respective first and second connection points and including at least one programmable impedance circuit disposed between the first and second connection points.

31. The apparatus as in claim 30, further comprising:
first and second integrated circuits attached to the interconnect substrate,
wherein the at least one wiring trace couples the first and second integrated circuits and the signal buffer integrated circuit is coupled therebetween.

32. A packaged signal buffer integrated circuit comprising:
one or more pairs of connection points and respective one or more programmable impedance circuits coupled therebetween, the one or more pairs of connection points placed in accordance with a trace pitch of an interconnect substrate,
wherein at least one of the programmable impedance circuits is programmable after the packaged signal buffer integrated circuit is mounted upon the interconnect substrate and coupled into one or more respective wiring traces thereof.

33. An apparatus comprising:
a powered, programmable impedance integrated circuit; and
means for connecting input and output nodes of the programmable impedance integrated circuit into a first wiring trace of an interconnect substrate without interfering with placement and connection of an adjacent substantially identical programmable impedance integrated circuit and connection means into an immediately adjacent second wiring trace of the interconnect substrate, wherein the first and second wiring traces are displaced according to a prevailing trace pitch.

34. The apparatus of claim 33, further comprising:
the interconnect substrate.

35. A packaged integrated circuit comprising:
plural powered, programmable impedance circuits; and
means for connecting input and output nodes of respective ones of the programmable impedance circuits into respective wiring traces of an interconnect substrate wherein the wiring traces are displaced from each other in accordance with a prevailing trace pitch.

36. The apparatus of claim 35, further comprising:
the interconnect substrate.

37. A signal buffer integrated circuit comprising:
plural connection point pairs; and
plural programmable impedance circuits coupled between respective of the connection points;
wherein at least one of the programmable impedance circuits comprises an input impedance control circuit, an output impedance control circuit and a signal gain amplifier coupled therebetween.

38. A signal buffer integrated circuit comprising:
plural connection point pairs; and
plural programmable impedance circuits coupled between respective of the connection points;
wherein at least one of the programmable impedance circuits is responsive to an externally-supplied programming signal;
wherein the eternally-supplied programming signal is coupled into the signal buffer via one or more of the connection points.

39. A signal buffer integrated circuit comprising:
plural connection point pairs; and
plural programmable impedance circuits coupled between respective of the connection points;
wherein at least one of the programmable impedance circuits is responsive to an externally-supplied programming signal;
wherein the externally-supplied programming signal is coupled into the signal buffer via the power supply voltage terminal.

40. A signal buffer integrated circuit comprising:
plural connection point pairs; and
plural programmable impedance circuits coupled between respective of the connection points;
wherein at least one of the programmable impedance circuits further comprises separately programmable input and output impedance circuits.

* * * * *